United States Patent
Kim

(10) Patent No.: US 8,513,991 B2
(45) Date of Patent: Aug. 20, 2013

(54) DELAY-LOCKED LOOP HAVING A LOOP BANDWIDTH DEPENDENCY ON PHASE ERROR

(75) Inventor: Youn-Cheul Kim, Ichon-si (KR)

(73) Assignee: Hynix Semiconductor Inc., Ichon-si (KR)

( * ) Notice: Subject to any disclaimer, the term of this patent is extended or adjusted under 35 U.S.C. 154(b) by 617 days.

(21) Appl. No.: 12/818,945

(22) Filed: Jun. 18, 2010

(65) Prior Publication Data
US 2011/0309866 A1 Dec. 22, 2011

(51) Int. Cl.
*H03L 7/06* (2006.01)
(52) U.S. Cl.
USPC ............................................. 327/156
(58) Field of Classification Search
USPC .................................................. 327/156–161
See application file for complete search history.

(56) References Cited

U.S. PATENT DOCUMENTS

| 6,911,850 | B2 | 6/2005 | Okamura | |
|---|---|---|---|---|
| 2010/0013531 | A1 * | 1/2010 | Ainspan et al. | 327/159 |

FOREIGN PATENT DOCUMENTS

| KR | 1020020042161 A | 6/2002 |
|---|---|---|
| KR | 2003-0017623 A | 3/2003 |

* cited by examiner

*Primary Examiner* — Daniel Rojas
(74) *Attorney, Agent, or Firm* — Kilpatrick Townsend & Stockton LLP

(57) ABSTRACT

Circuits, methods, and apparatus that vary one or more attributes or parameters of a closed-loop clock circuit as a function of a characteristic of its phase error. One example provides a delay-locked loop having a loop bandwidth that can be varied as a function of its phase error. In this specific example, current phase error is determined. This determination may be made directly, either by measuring phase error, or indirectly, by determining if phase error is within one or more ranges of values. Once the phase error is determined, the loop bandwidth can be set. In one example, the loop bandwidth is set by adjusting the depth, type, or depth and type of the delay-locked loop's loop filter. In this way, large phase errors can be reduced quickly by increasing loop bandwidth, while small phase errors can be used to decrease loop bandwidth, thereby improving jitter performance.

7 Claims, 11 Drawing Sheets

DELAY-LOCKED LOOP HAVING A LOOP BANDWIDTH DEPENDENCY ON PHASE ERROR

BACKGROUND

Closed-loop clock circuits, such as phase-locked and delay-locked loops, are useful in many applications, including clock and data recovery, data retiming, clock regeneration, and other functions. Delay-locked loops are particularly useful in high-speed systems, such as high-speed memory systems.

Delay-locked loops can generate clock signals, or they can receive clocks signals. For example, a delay-locked loop in a first circuit may generate and provide a clock signal to a delay-locked loop in a second circuit. These delay-locked loops can clean up clock signals by removing jitter and spurious noise components. They can also retime signals to improve the performance of data transfer systems.

Various parameters or attributes can be used to describe the operating characteristics of these closed-loop clock circuits such as delay-locked loops. Loop bandwidth is one such key parameter for delay-locked loops. As loop bandwidth is increased, the resulting jitter is increased, but acquisition time, the time it takes for a delay-locked loop to lock onto an incoming clock signal, is reduced. Conversely, as loop bandwidth is decreased, the resulting jitter is decreased, but the acquisition time is increased.

Thus, jitter and acquisition time can be traded off against each other, but they cannot both be optimized. That is, all things being equal, a decrease in jitter comes at the expense of an increase in acquisition time. Similarly, a decrease in acquisition time comes at the expense of an increase in jitter.

Under most circumstances, it is desirable to decrease jitter. A reduced jitter improves data recovery and reduces transmission errors. But on occasion, for example, when phase error is large, a decrease in acquisition time becomes desirable, even at the expense of increased jitter. Again, jitter and acquisition time can be varied by adjusting loop bandwidth.

Thus, what is needed are circuits, methods, and apparatus that allow the bandwidth for closed-loop clock circuits, such as phase-locked and delay-locked loops, to vary with changes in phase error.

SUMMARY

Accordingly, embodiments of the present invention provide circuits, methods, and apparatus that vary one or more attributes or parameters of a closed-loop clock circuit as a function of one or more characteristics of its phase error. A specific embodiment of the present invention provides a delay-locked loop having a loop bandwidth that can be varied as a function of its phase error. The changes in loop bandwidth result in changes in acquisition time, allowing the closed-loop clock circuit to reduce large phase errors quickly.

In this specific embodiment of the present invention, phase error is determined by comparing a phase of a received clock signal to a phase of a retimed clock signal, and determining if the absolute difference in phase is greater than one or more threshold values. The larger the determined phase error, the more desirable it is to increase loop bandwidth, resulting in a reduced acquisition time. Conversely, the smaller the determined phase error, the more desirable it is to decrease loop bandwidth, resulting in a reduced jitter.

Once the phase error is determined, the loop bandwidth of the delay-locked loop can be set. In a specific embodiment of the present invention, loop bandwidth is controlled by a loop filter. This loop filter may be a moving-average filter, low pass filter, or other type of filter. The depth of the filter may be varied as a function of the determined phase error. In this way, the loop bandwidth, and the resulting jitter and acquisition times, are set to desirable values as the phase error changes. In other embodiments of the present invention, the type of filter, or both the type and depth of the filter, may be varied as a function of the determined phase error.

In various embodiments of the present invention, the retimed signal provided by the closed-loop clock circuit may need to be buffered, provided to a pad, or delayed in other ways. In such circumstances, it may be desirable to eliminate the delay of these circuits from the retimed signal. Accordingly, embodiments of the present invention may employ an emulator circuit. This emulator circuit provides a delay that approximately matches the delay caused by buffers, pads or other components. The emulator circuit may be inserted in a feedback path in the closed-loop clock circuit.

Various embodiments of the present invention may incorporate one or more of these and the other features described herein. A better understanding of the nature and advantages of the present invention may be gained by reference to the following detailed description and the accompanying drawings.

BRIEF DESCRIPTION OF THE DRAWINGS

FIG. 3A illustrates a delay-locked loop according to an embodiment of the present invention, while

DESCRIPTION OF ILLUSTRATIVE EMBODIMENTS

Figure 1:
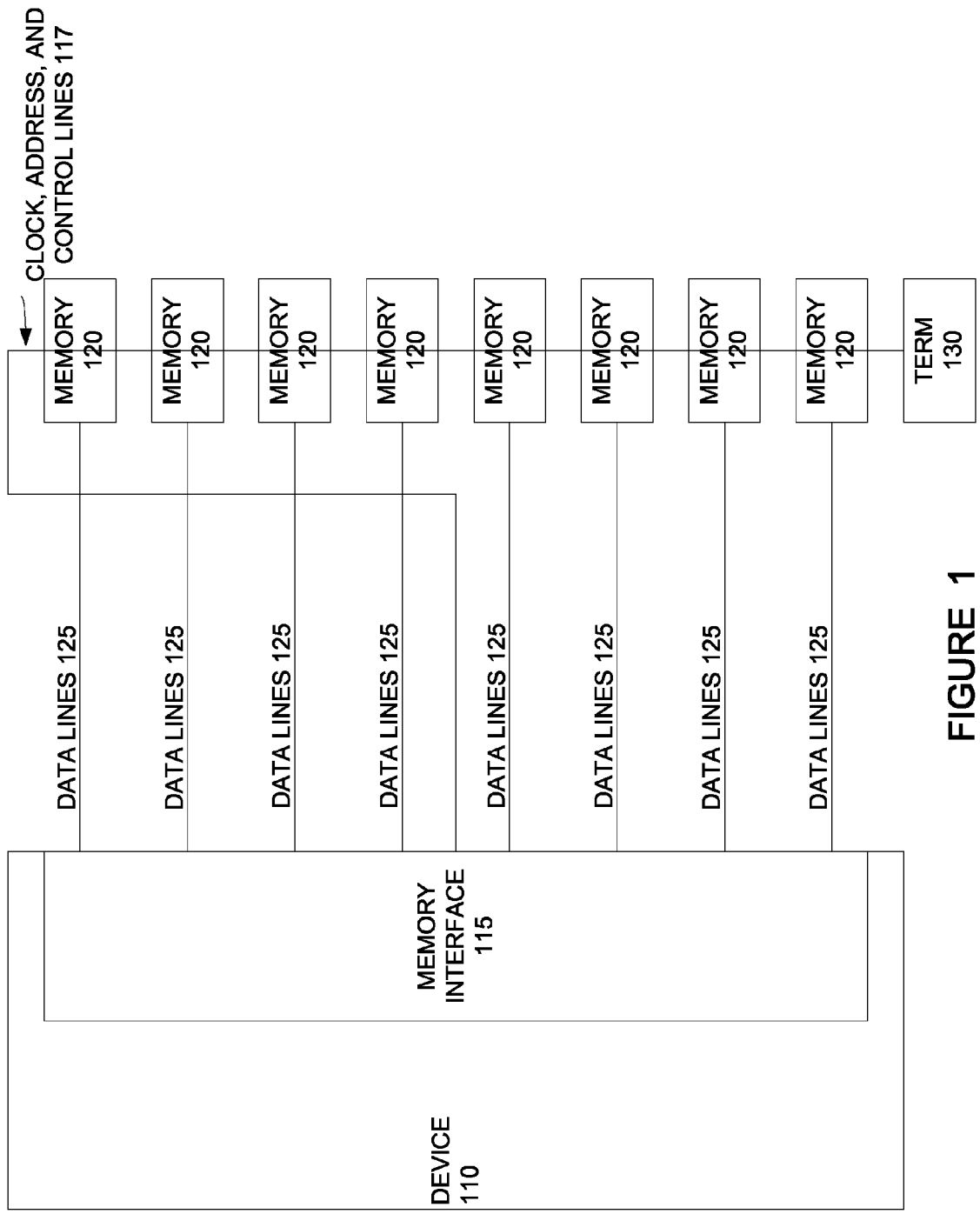
FIG. 1 illustrates a memory subsystem that is improved by the incorporation of an embodiment of the present invention.

FIG. 1 illustrates a memory subsystem that is improved by the incorporation of an embodiment of the present invention. This memory subsystem may be compatible with DDR3 or other memory standards. This figure, as with the other included figures, is shown for illustrative purposes and does not limit either the possible embodiments of the present invention or the claims.

In this memory subsystem, device 110 stores data in, and retrieves data from, a number of memories 120. Device 110 includes memory interface 115 that couples through data lines 125 to memories 120. Memory interface 115 provides clock, address, and control signals to the memories 120 on lines 117. Lines 117 are terminated by termination 130. The clock signals provided on lines 117 may be single-ended or differential signals. In various embodiments of the present invention, they may be unidirectional or bidirectional signals.

In this example, clock signals are provided by memory interface 115 to the memories 120. The clock lines follow a flyby route; that is, they are routed sequentially from one memory 120 to the next. The clock lines are terminated by termination 130. Termination 130 may include resistors or other terminating components.

Again, this circuitry is a memory subsystem where communications take place between device 110 and memories 120. Device 110 may be a processor, graphics processor, or other type of circuit. Memories 120 may be dynamic random access memories, or other types of memory device. Interface 115 and memories 120 may be compatible with standards such as DDR3, or other standard or proprietary memory specifications.

Other types of electronic systems and circuits may be improved by the incorporation of embodiments of the present invention. Again, this memory subsystem employs a flyby routing technique for the clock lines. In other embodiments of the present invention, other circuit topologies, such as star routing, may be used.

Again, in this flyby topology, the clock is received by each memory 120 sequentially. Memories 120 that are closer to termination 130 receive the clock signal last, while memories further away from termination 130 receive the clock signal earlier. For this reason, jitter performance may be worse at the memories 120 closest to termination 130. In order to improve performance, memory interface 115 and memories 120 may incorporate embodiments of the present invention. An example is shown in the following figure.

Figure 2:
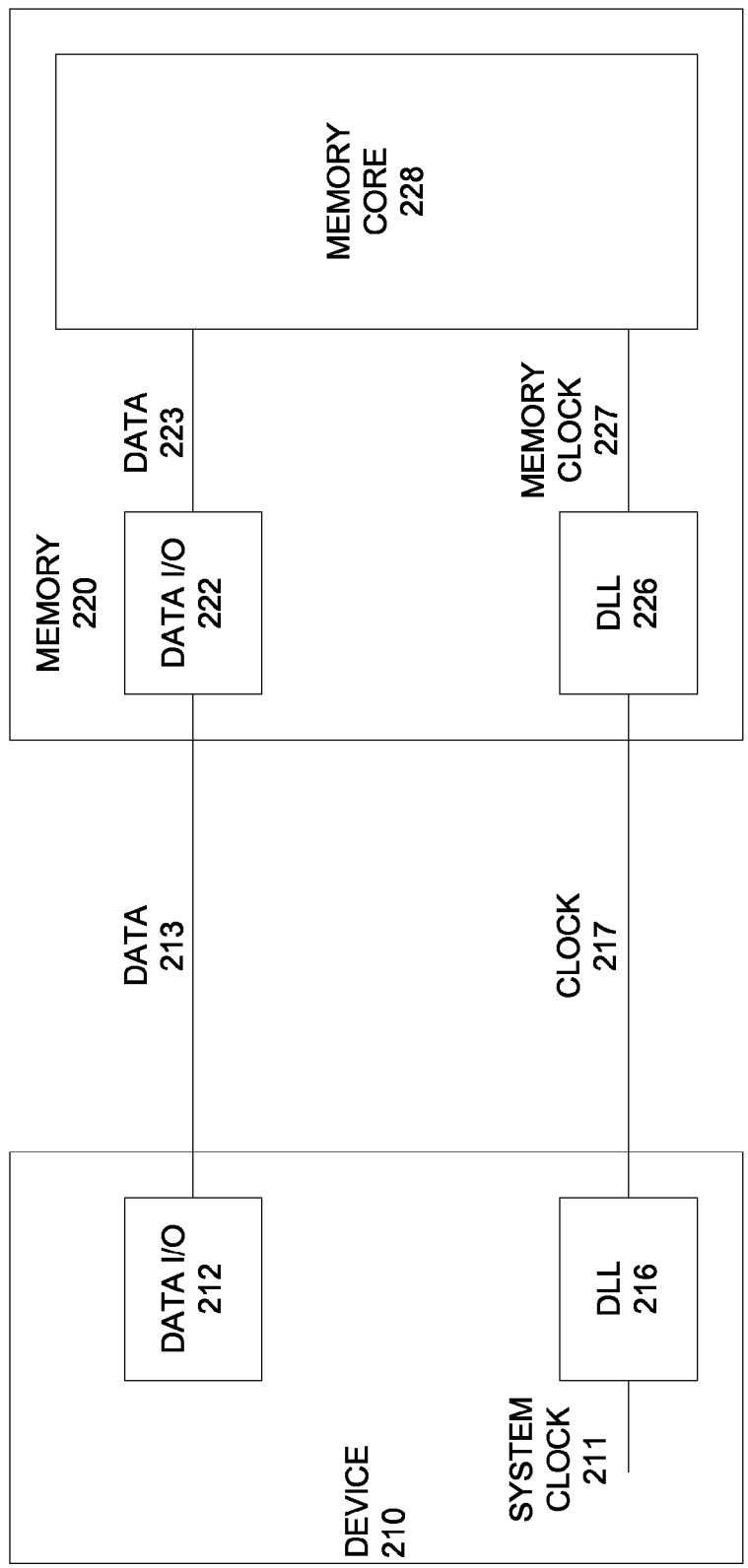
FIG. 2 illustrates a portion of a memory subsystem that is improved by the incorporation of an embodiment of the present invention.

FIG. 2 illustrates a portion of a memory subsystem that is improved by the incorporation of an embodiment of the present invention. This figure includes device 210 that is in communication with memory 220. Data is sent and received by device 210 using data I/O circuitry 212. Data is received and provided by memory 220 using data I/O circuitry 222. Data I/O circuitry 222 provides and receives data from the memory core 228 on lines 223.

In device 210, a system clock on line 211 is retimed by delay-locked loop 216 and provided on clock line 217. The clock signal on line 217 is received by delay-locked loop 226 and provided to the memory core 228 on the memory clock lines 227. In this way, device 210 can retime the clock signal provided on line 211 using delay-locked loop 216. Similarly, memory 220 can retime the clock signal received on line 217 using delay-locked loop 226. This in turn provides improved accuracy and data transfers between device 210 and memory 220.

In other systems that are improved by embodiments of the present invention, either or both of the delay-locked loops 216 and 226 can be replaced by phase-locked loops, clock generators or drivers, or other closed or open loop clock circuits. In one such system, delay-locked loop 216 is replaced by a phase-locked loop. In this system, a system clock received on line 211 is retimed by a phase-locked loop and received on line 217 by delay-locked loop 226. In another such system, a system clock received on line 211 is driven by a clock driver and received on line 217 by delay-locked loop 226.

In still other embodiments of the present invention, a separate delay-locked loop, phase-locked loop, or clock driver or generator may provide a clock signal on line 217. This clock signal may be retimed or driven by delay-locked loops, phase-locked loops, or clock drivers in device 210 and memory 220.

Again, embodiments of the present invention may be used to improved closed-loop clock circuits, such as phase-locked loops or delay-locked loops. An example of a delay-locked loop according to an embodiment of the present invention is shown in the following figure.

Figure 3A:
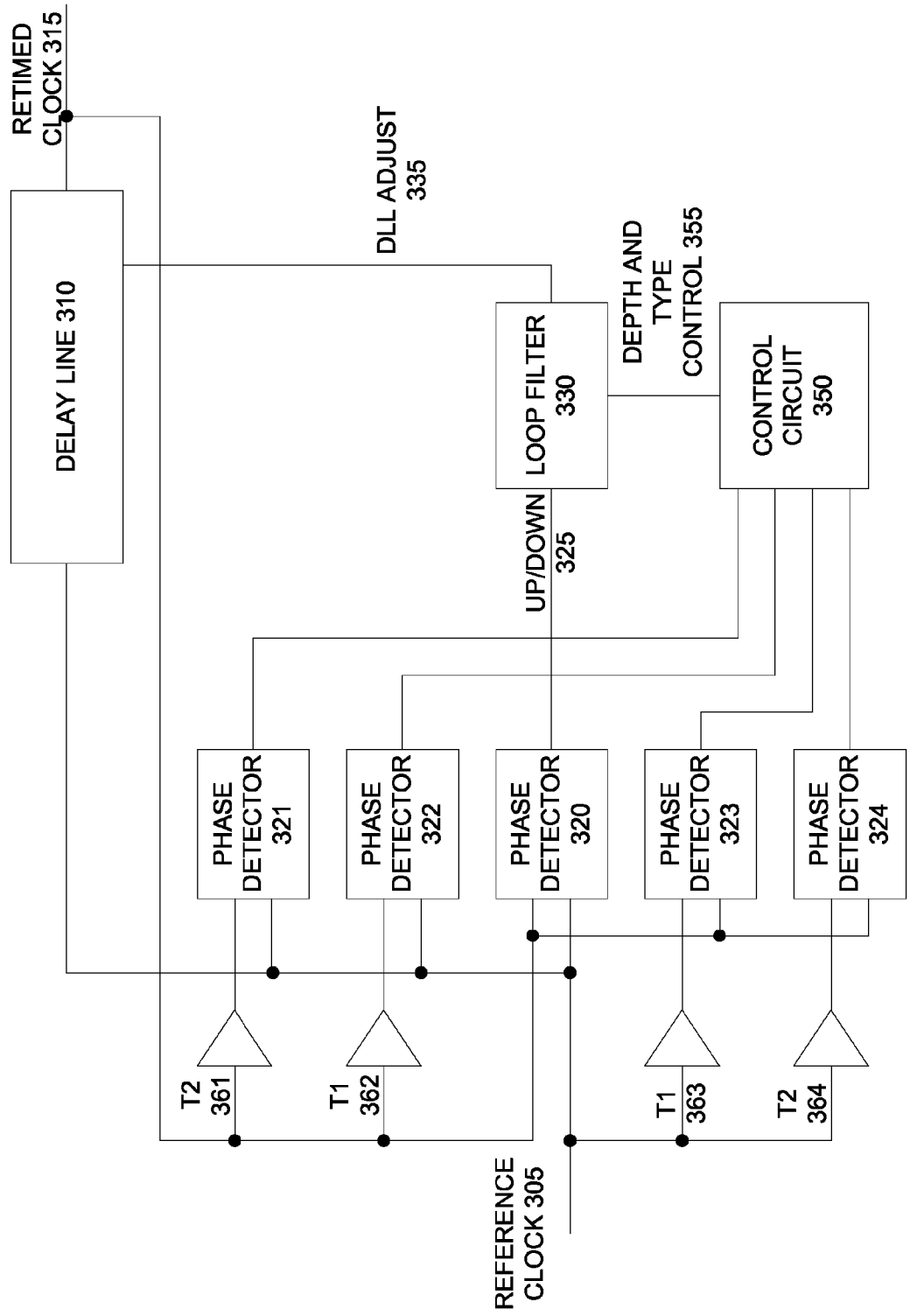

FIG. 3A illustrates a delay-locked loop according to an embodiment of the present invention. This figure includes a delay line 310, phase detectors 320-324, loop filter 330, register 340, control circuit 350, and delay elements 361-364.

A reference clock is received on line 305 by phase detector 320. The reference clock on line 305 may be a system clock generated by a crystal or other periodic source. The reference clock may also be a received clock signal from another circuit, for example, a circuit on a separate integrated circuit. In various embodiments of the present invention, the reference clock frequency, or operating frequency, may have different values. For example, the frequency of the reference clock may be 500 MHz, 1 GHz, 2 GHz, or other frequency.

In a specific embodiment of the present invention, phase detectors 320-324 may be D-type flip-flops. In other embodiments of the present invention, phase detectors 320-324 may be other appropriate circuitry. The reference clock on line 305 is further received by delay line 310. Delay line 310 may be a series of current starved inverters, or other appropriate delay circuits. The delay through the delay circuit 310 may be adjusted by DLL adjust signal on line 335.

Delay line 310 provides a retimed clock signal on line 315. In various embodiments of the present invention, this retimed clock signal on line 315 may be provided to circuitry such as memory core 228, memory device 220, or other circuit. The phase of the retimed clock signal on line 315 is compared to the phase of the reference clock on line 305 by phase detector 320. In this example, if the phase of the reference clock 305 is ahead of the phase of the retimed clock signal on line 315, phase detector 320 provides an up level on up/down signal 325.

The up/down signal on line 325 is received by loop filter 330. This loop filter may be a moving-average filter, low-pass filter, or other appropriate filter. For example, loop filter 330 may employ voting or averaging techniques. When loop filter 330 is a moving-average filter, it averages a number of samples and provides it as an output. The number of samples averaged is referred to as the filter's depth. As a new sample is received by the moving-average filter, it is used as part of a new average, while the oldest sample is dropped and not used. In a specific embodiment of the present invention, the depth may be 1, 2, 4, or 5. In other embodiments of the present invention, it may have other depths, such as 3, 6, 7, or more than 7.

When the depth of loop filter 330 is increased, more samples are averaged to generate the output DLL adjust on line 335. Since more samples are averaged, each sample has less immediate effect on the output. This in turn can be seen as a reduction in loop bandwidth. As mentioned above, a reduced bandwidth decreases jitter, but at the cost of increased signal acquisition time.

Again, as the phase error, which is the phase difference between the reference clock signal on line 305 and the retimed reference clock signal on line 315, varies, it is desirable to also change the acquisition time. For example, for large phase errors, it is desirable to reduce the acquisition time to allow the phase error to be quickly reduced. By changing the filter depth, and thus the loop bandwidth, the acquisition time can be corrected.

Loop filter 330 provides a delay-locked loop adjust signal on line 335. In this example, if the up/down signal on line 325 indicates up, the DLL adjust signal on line 335 acts to shorten the delay through delay line 310. This in turn advances edges of the retimed clock signal on line 315, thereby bringing the retimed clock signal on line 315 in phase with the reference clock on line 305.

Again, it is desirable to change various attributes or parameters of this loop depending on a characteristic of its phase error. For example, in a specific embodiment of the present invention, a bandwidth of loop filter 330 is varied with changes in phase error.

In various embodiments of the present invention, the phase error may be determined in various ways. For example, the phase error between the reference clock on line 305 and the retimed clock on line 315 may be directly measured. Alternately, it may be determined whether this phase error lies within one of a number of ranges. For example, it may be determined whether the absolute value of the phase error is greater than or less than a threshold value. In other embodiments of the present invention, a number of ranges or windows may be used. In this case, it is determined which of the possible windows the current phase error lies in. Again, the larger the phase error, the wider the bandwidth of loop filter 330 can be set. Also, the delays 361-364 that define the phase error windows may be arranged in different ways. An example is shown in the following figure.

Figure 3B:
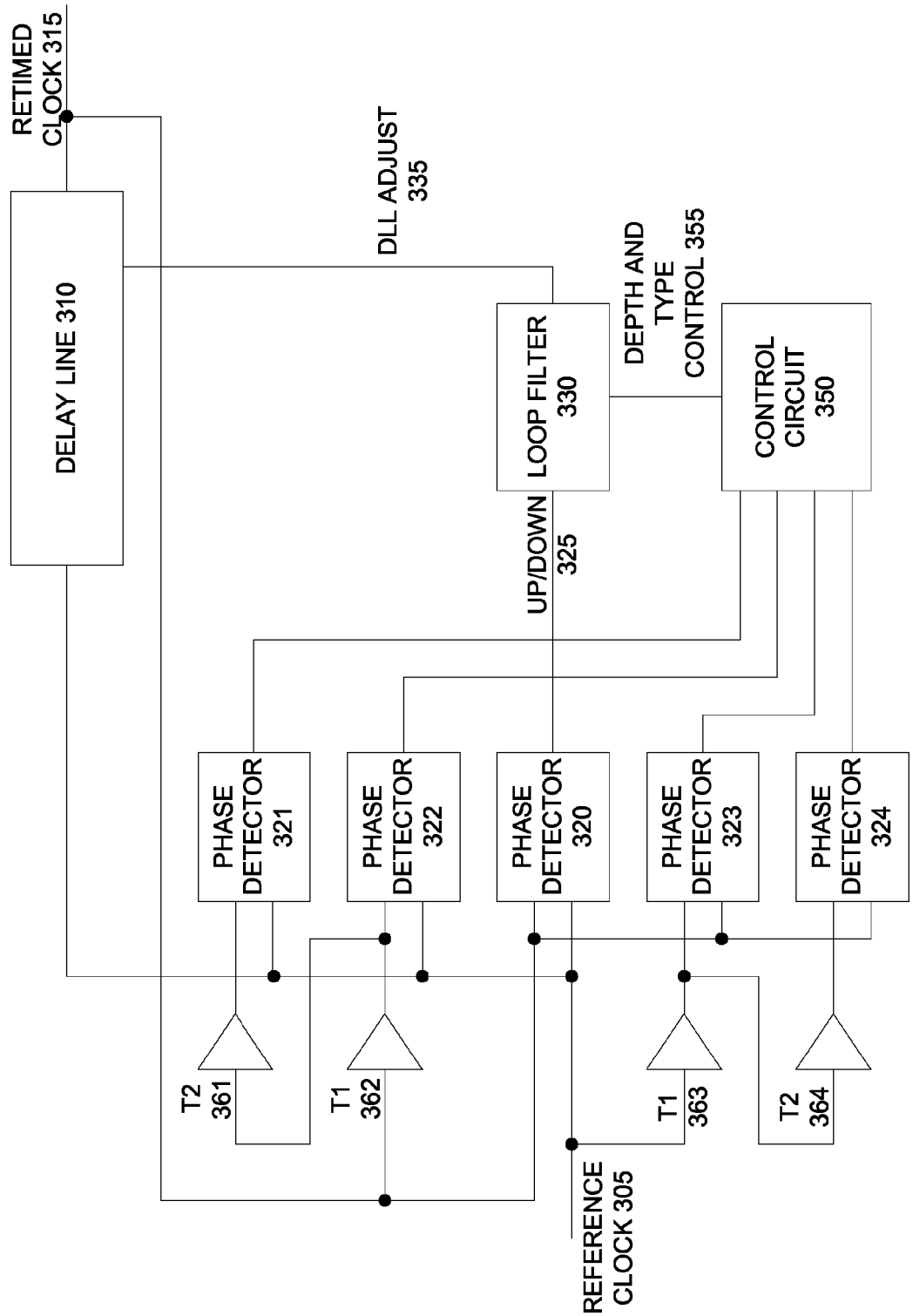
FIG. 3B illustrates another delay-locked loop according to an embodiment of the present invention.

FIG. 3B illustrates a delay-locked loop according to an embodiment of the present invention. This figure includes a delay line 310, phase detectors 320-324, loop filter 330, register 340, control circuit 350, and delay elements 361-364.

In this embodiment of the present invention, delay elements 361 and 364 are placed in series with delay elements 362 and 363. In this way, the delay seen by phase detectors 322 and 323 is T1, while the delay seen by phase detectors 321 and 324 is T1 plus T2. Accordingly, this configuration may provide a benefit in controlling tolerances between delays seen by phase detectors 321-324, since at least part of the delays seen by the phase detectors are generated by shared circuits.

In these examples, delay elements 361-364 and phase detectors 321-324 are used to create a total of five windows. Control circuit 350 receives outputs from phase detectors 321-324 and determines which of these five windows the current phase error is in. Depending on the magnitude of the current phase error, control circuit 350 provides depth and type control on lines of 355 to loop filter 330. Again, the depth of loop filter 330 is the number of up/down signal 325 bits that are averaged by the moving average filter. The depth of filter 330 may be varied depending on the phase error. Alternately, the type of filter may be changed based on the magnitude of the phase error. Alternately, both the depth and type of filter may be changed based on the determined phase error. These acts are shown in further detail in the following figures.

Figure 4A:
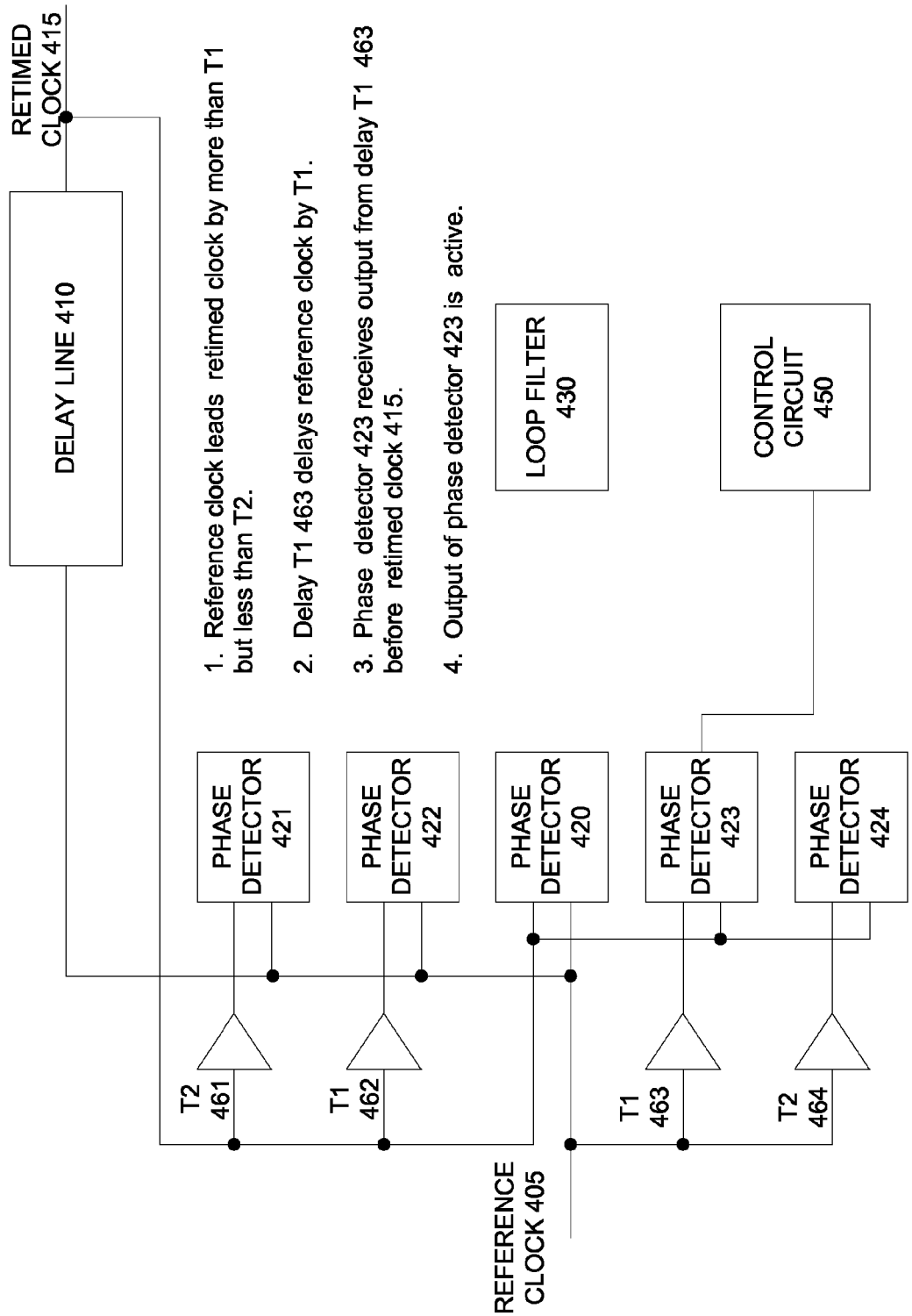
FIGS. 4A-4C illustrate the transfer of data in a delay-locked loop according to an embodiment of the present invention.
Figure 4B:
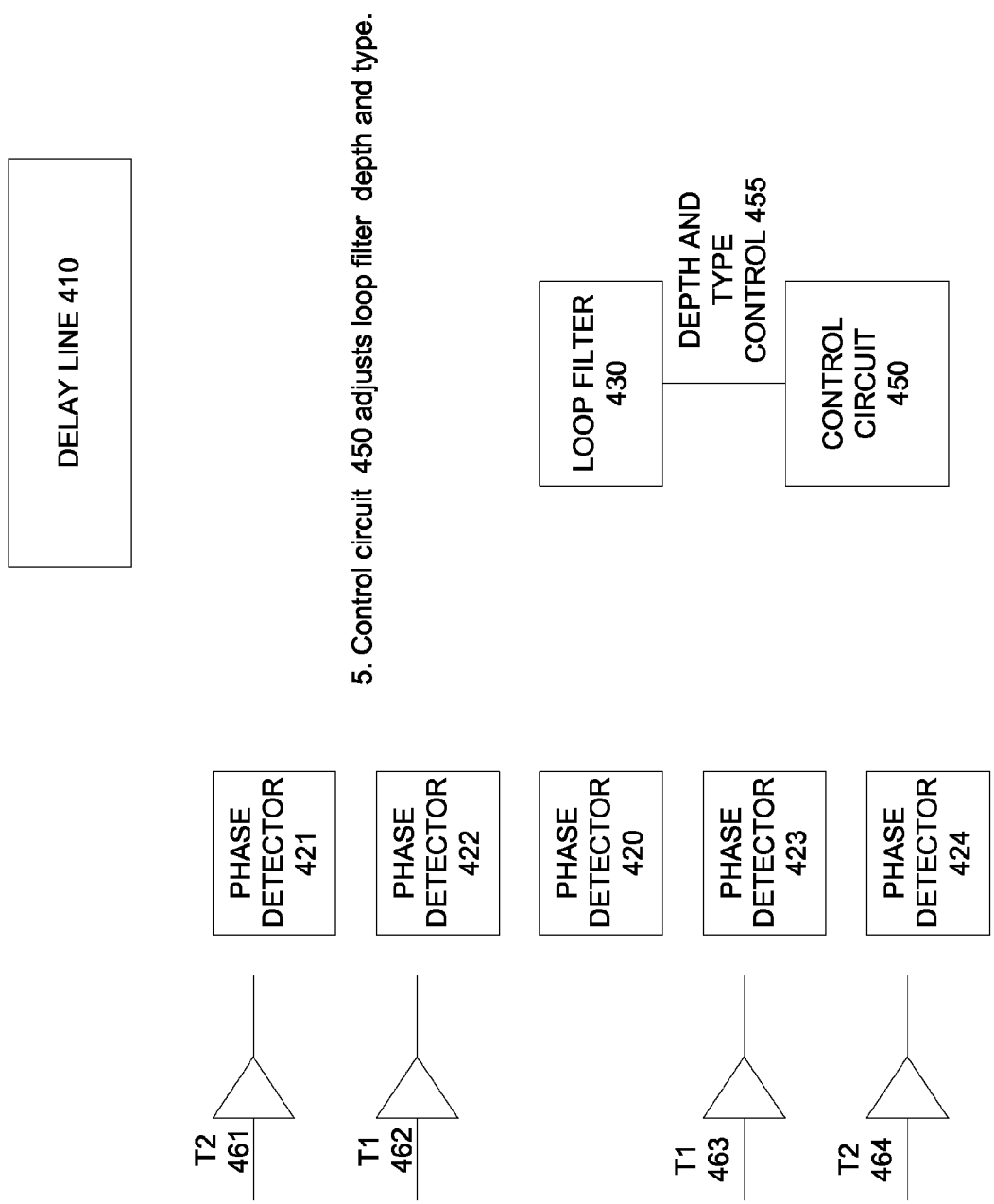
Figure 4C:
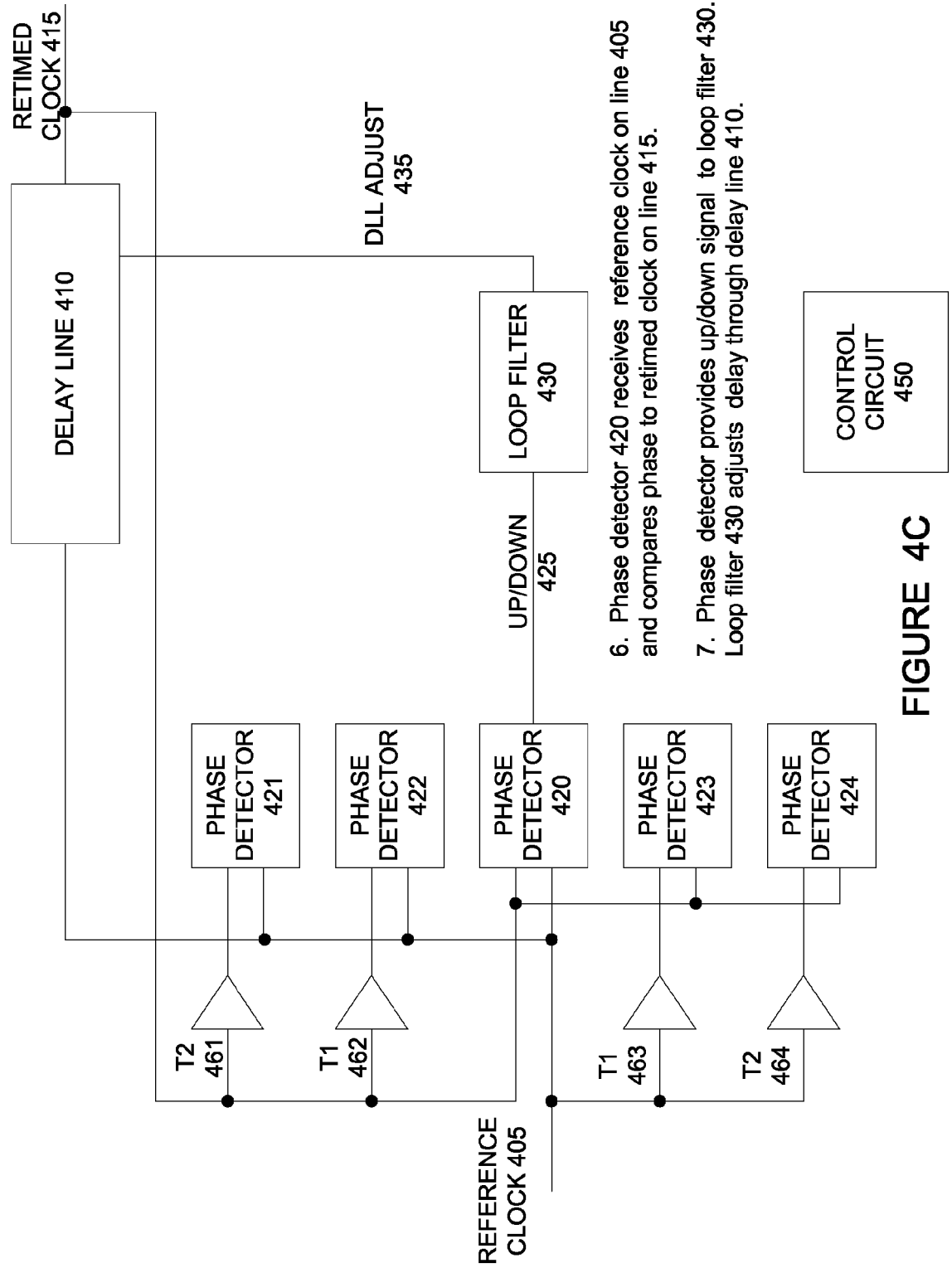

FIGS. 4A-4C illustrate the transfer of data in a delay-locked loop according to an embodiment of the present invention. In FIG. 4A, the retimed clock on line 415 is delayed by delay elements 461 and 462, and compared to the reference clock on line 405. Similarly, the reference clock on line 405 is delayed by delay elements 463 and 464, and compared to the retimed clock on line 415. In this example, the reference clock on line 405 leads the retimed clock on line 415 by more than a delay of T1 but less than a delay of T2. Delay 463 delays the reference clock by a delay of T1. Accordingly, phase detector 423 receives an output from delay element 463 before it receives the retimed clock on line 415. This causes the output of phase detector 423 to be active.

In FIG. 4B, control circuit 450 receives the outputs of phase detectors 421-424, generates depth and type control signals on lines 455, and provides them to the loop filter 430. The loop filter 430 may be a moving-average filter, low-pass filter, or other type of filter. Again, the depth control signal may change the number of samples averaged by the loop filter 430. Alternately, the type of loop filter may be changed from a moving-average filter to a low-pass filter, or it may change from a low-pass filter to a moving-average filter. Alternately, the loop filter may be changed between or among other types of loop filters.

In FIG. 4C, phase detector 420 receives reference clock on line 405 and compares its phase to the phase of the retimed clock signal on line 415. Phase detector 420 provides an up/down signal to loop filter 430. Loop filter 430 provides a delay-locked loop adjust signal on line 435. The delay-locked loop adjust signal on line 435 adjusts the delay through the delay line 410, such that the phase of the retimed clock signal on line 415 matches the phase of the reference clock on line 405.

Figure 5:
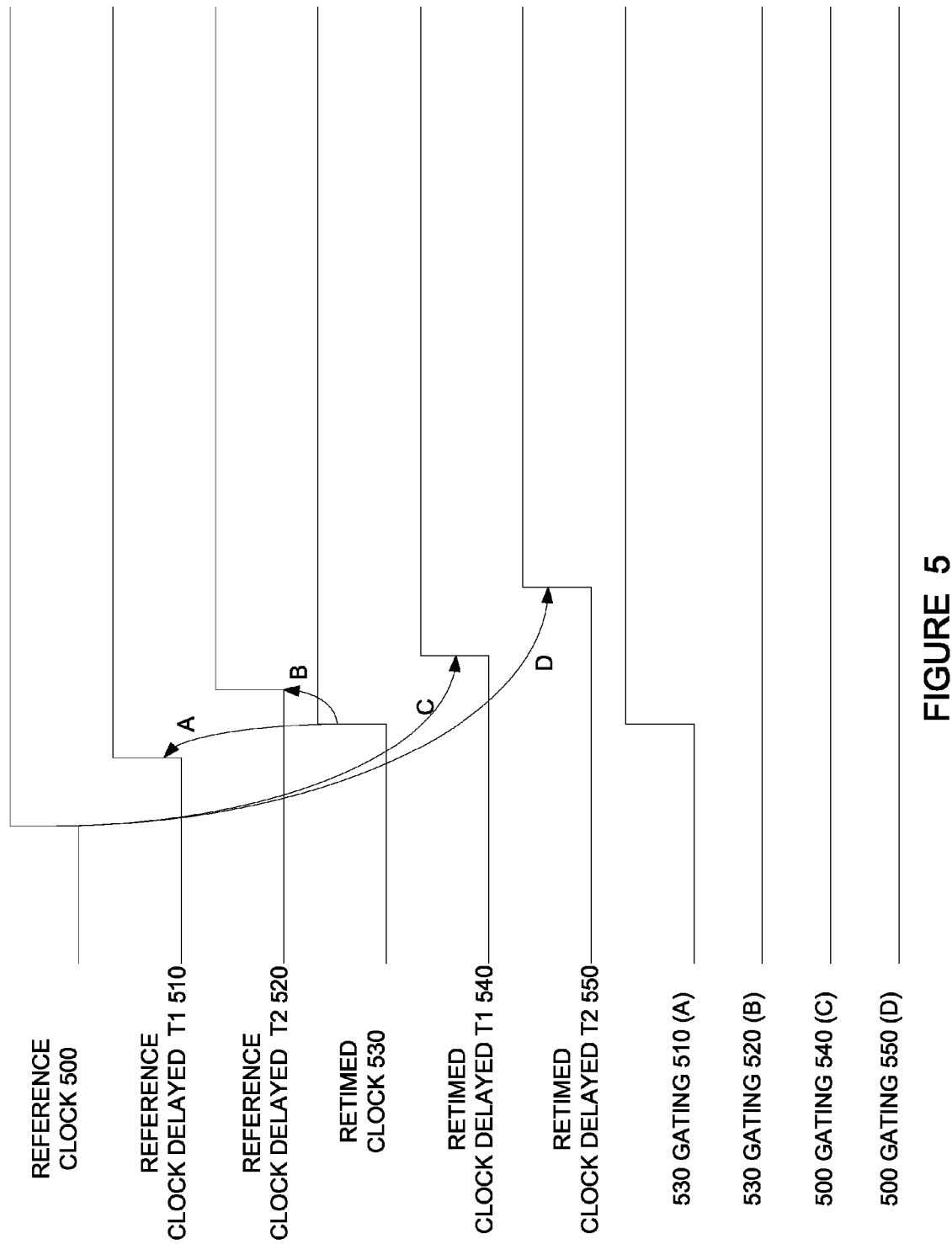
FIG. 5 is a timing diagram illustrating the operation of the phase error detection circuitry of FIG. 3.

FIG. 5 is a timing diagram illustrating the operation of the phase error detection circuitry of FIG. 3. These waveforms include a reference clock 500 and a retimed clock 530. Both signals are delayed by delays T1 and T2, where T2 is greater than T1. The retimed clock 530 is used to gate the reference clock, which is delayed by T1. Since the delayed reference clock 510 leads the retimed clock 530, as is indicated by arrow A, the output of signal A is asserted high. Since the reference clock 520 is delayed by T2, it is asserted high after the rising edge of retimed clock 530, as is indicated by arrow B. Accordingly, signal B is not asserted high. Similarly, signals C and D are not asserted. By examining which of the signals A, B, C, and D are asserted, the magnitude of the phase error between the reference clock 500 and retimed clock 530 may be assigned to one of five windows. While this example illustrates the use of five windows, in other embodiments of the present invention other numbers of windows may be used.

In various embodiments of the present invention, the retimed clock signal may need to be buffered, provided to a pad, or it may be delayed in other ways. In various embodiments of the present invention, it desirable to compensate for the delays. Accordingly, an emulator circuit that matches these delays may be used. An example is shown in the following figure.

Figure 6:
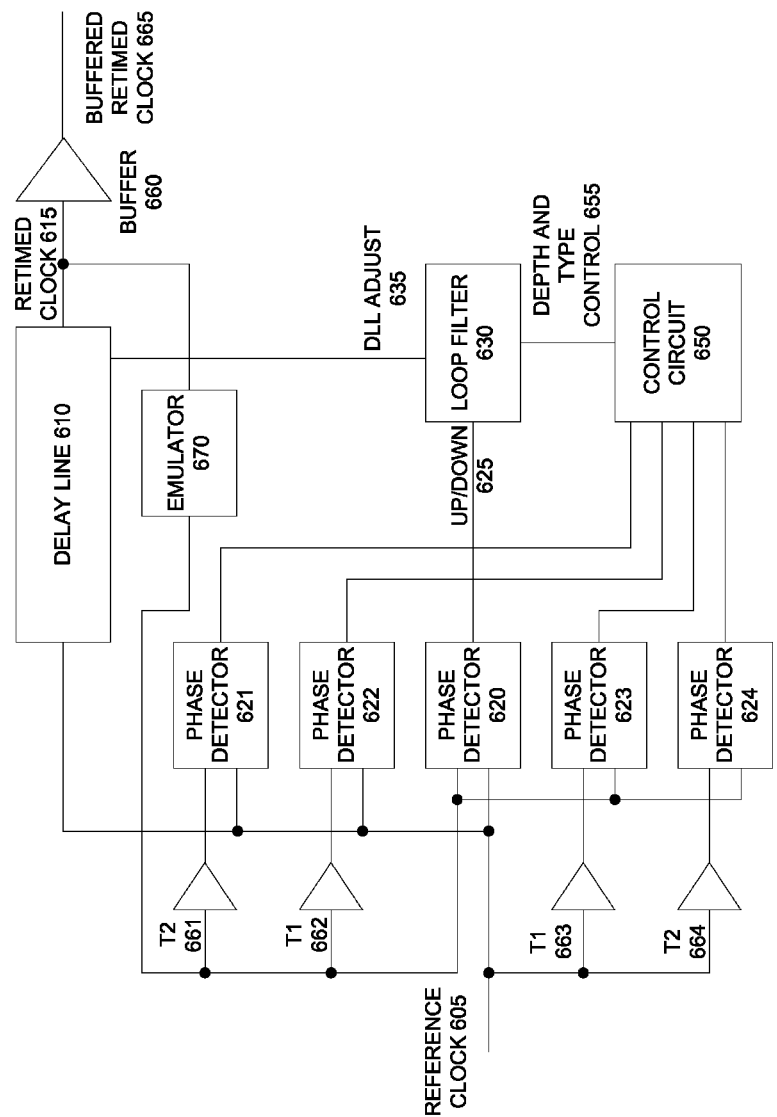
FIG. 6 illustrates a delay-locked loop that includes an emulator circuit according to an embodiment of the present invention.

FIG. 6 illustrates a delay-locked loop that includes an emulator circuit according to an embodiment of the present invention. In this example, buffer 660 is included to buffer the retimed clock signal on line 615 to provide a buffered retimed clock signal on line 665. The retimed clock signal on line 615 is thus delayed by the buffer 660 to generate the buffered retimed clock signal on line 665. An emulator 670 is inserted between the output of delay line 610 and the input of phase detector 620. The emulator 620 emulates the delay through the buffer 660, as well as any other associated delays caused by pads or other circuits.

Again, embodiments of the present invention provide closed-loop clock circuits where an attribute or parameter of a closed-loop clock circuit is set depending on a characteristic relating to a phase error of the closed-loop clock circuit. An example is shown in the following figure.

Figure 7:
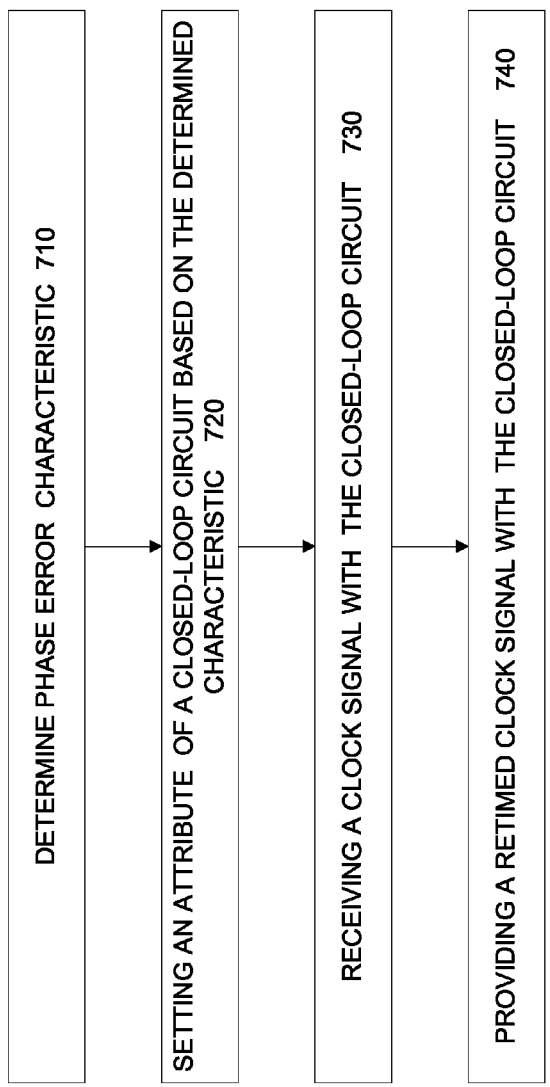
FIG. 7 is a flowchart of a method of retiming a clock signal according to an embodiment of the present invention.

FIG. 7 is a flowchart of a method of retiming a clock signal according to an embodiment of the present invention. In act 710, a characteristic relating to phase error is determined. Again, this may be the phase error itself, it may be the determination that the phase error is in a specific window, or it may be another characteristic. An attribute of a closed-loop clock circuit is set based on the determined characteristic in act 720. Again, the attribute may be a depth or type of filter. In act 730, a clock signal is received by the closed-loop clock circuit. A retimed clock signal is provided by the closed-loop clock circuit in act 740.

Again, in a specific embodiment of the present invention, the determination that phase error is in a certain range of values is used in determining the depth, type, or both depth and type, of the loop filter in a delay-locked loop. An example is shown in the following figure.

Figure 8:
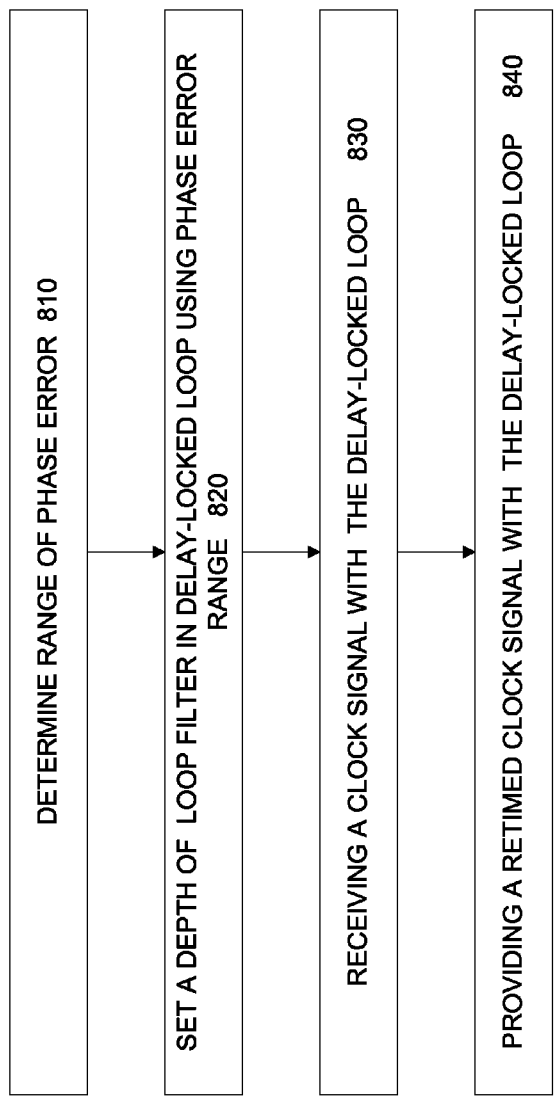
FIG. 8 illustrates a flowchart of a method of retiming a clock signal according to an embodiment of the present invention.

FIG. 8 illustrates a flowchart of a method of retiming a clock signal according to an embodiment of the present invention. In act 810, a determination that a phase error is in a range of values is made. In act 820, a depth, type, or both depth and type, of a loop filter in a delay-locked loop is set using the phase error range. A clock signal is received with the delay-locked loop in act 830. A retimed clock signal is provided using the delay-locked loop in act 840. A retimed clock signal is provided using the delay-locked loop in act 740.

In these examples, the depth, type, or both depth and type, of a loop filter is varied depending on phase error. In other embodiments of the present invention, the depth, type, or both depth and type, of a loop filter is varied depending on both phase error and operating frequency. Examples of how the depth and type of the loop filter can be varied due to operating frequency can be found in copending U.S. patent application Ser. No. 12/818,929, titled DELAY-LOCKED LOOP HAVING LOOP BANDWIDTH DEPENDENCY ON OPERATING FREQUENCY, by Kim, which is incorporated by reference.

In an embodiment of the present invention, both the operating frequency and a range for a phase error are determined. Based on these determinations, a depth and type of filter for a loop filter are set. In a specific embodiment of the present invention, the operating frequency is determined by reading a value for column address select latency. In this specific embodiment, it is also determined whether a current phase error is larger than one or more threshold values. Based on the value for column address select latency and the size of the phase error, either or both of the depth and type of filter are adjusted.

The above description of embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated. Thus, it will be appreciated that the invention is intended to cover all modifications and equivalents within the scope of the following claims.

What is claimed is:

1. An integrated circuit comprising:
    an input/output circuit comprising a delay-locked loop, the delay-locked loop comprising:
        a phase detector having a first input to receive a clock signal;
        a loop filter having an input coupled to an output of the phase detector; and
        a delay line coupled to receive the clock signal, an output to provide a retimed clock signal to a second input of the phase detector, and a control input to receive an output of the loop filter; and
    a control circuit to determine a range of a phase error between the received clock signal and the retimed clock signal, and to use the determined phase error range to set a depth of the loop filter.

2. The integrated circuit of claim 1 wherein the loop filter is a moving-average filter.

3. The integrated circuit of claim 1 wherein the determined phase error range is also used to set a type for the loop filter.

4. The integrated circuit of claim 3 wherein the first input of the phase detector is coupled to a pad.

5. The integrated circuit of claim 4 wherein the output of the delay line is coupled to a memory core.

6. The integrated circuit of claim 3 wherein the types of filters are filters in the group of filters consisting of a moving-average filter, a low-pass filter, a voting scheme filter, and an averaging filter.

7. The integrated circuit of claim 1 wherein the control circuit includes a plurality of delay elements.

* * * * *